(12) United States Patent
Tashiro et al.

(10) Patent No.: US 10,594,003 B2
(45) Date of Patent: Mar. 17, 2020

(54) BATTERY SYSTEM

(71) Applicant: TOYOTA JIDOSHA KABUSHIKI KAISHA, Toyota-shi, Aichi-ken (JP)

(72) Inventors: Hiroki Tashiro, Aichi (JP); Junko Amano, Toyota (JP); Hideaki Oka, Nisshin (JP); Shuji Tomura, Nagakute (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 55 days.

(21) Appl. No.: 15/305,266

(22) PCT Filed: Apr. 16, 2015

(86) PCT No.: PCT/IB2015/052779
§ 371 (c)(1),
(2) Date: Oct. 19, 2016

(87) PCT Pub. No.: WO2015/162525
PCT Pub. Date: Oct. 29, 2015

(65) Prior Publication Data
US 2017/0047622 A1    Feb. 16, 2017

(30) Foreign Application Priority Data

Apr. 21, 2014  (JP) ................... 2014-087773

(51) Int. Cl.
*H01M 10/48*    (2006.01)
*G01R 31/389*    (2019.01)

(52) U.S. Cl.
CPC ........ *H01M 10/486* (2013.01); *G01R 31/389* (2019.01); *H01M 10/48* (2013.01); *H01M 2220/20* (2013.01)

(58) Field of Classification Search
CPC .. G01R 31/362; H01M 10/48; H01M 10/486; H01M 2220/20
See application file for complete search history.

(56) References Cited

U.S. PATENT DOCUMENTS

2010/0204861 A1*  8/2010  Kaita .................. B60L 11/1851
                                                          701/22
2014/0159736 A1   6/2014  Morimoto et al.
2017/0005373 A1   1/2017  Tashiro

FOREIGN PATENT DOCUMENTS

CN        106104905 A    11/2016
EP         2204872 A1     7/2010
(Continued)

*Primary Examiner* — Daniel S Gatewood
(74) *Attorney, Agent, or Firm* — Sughrue Mion, PLLC

(57) ABSTRACT

A battery system according includes a secondary battery, a temperature sensor and a controller. The secondary battery includes a power generation element configured to perform charging and discharging, an electrolyte, and a battery case. The electrolyte is impregnated inside the power generation element. The power generation element and the electrolyte is housed in the battery case. The temperature sensor is configured to specify a temperature of the secondary battery. The controller is configured to calculate a deviation in salt concentration in the electrolyte. The controller is configured to calculate a first flow velocity and a second flow velocity at each position in the power generation element in the flow direction of the electrolyte using an equation defining a flow of the electrolyte. The first flow velocity is a flow velocity when the electrolyte flows from an inside of the power generation element toward an outside of the power generation element. The second flow velocity is a flow velocity when the electrolyte flows from the outside of the power generation element toward the inside of the power generation element. The equation includes, as a parameter, a density of the electrolyte. The density is specified from the (Continued)

temperature. The density changes according to the temperature of the secondary battery. The controller is configured to calculate a salt concentration distribution in the power generation element based on the first flow velocity and the second flow velocity.

13 Claims, 7 Drawing Sheets

(56) References Cited

FOREIGN PATENT DOCUMENTS

| | | | |
|---|---|---|---|
| JP | 2010-060406 | A | 3/2010 |
| JP | 2013-083525 | A | 5/2013 |
| WO | 2013/018143 | A1 | 2/2013 |

\* cited by examiner

BATTERY SYSTEM

BACKGROUND OF THE INVENTION

1. Field of the Invention

The invention relates to a battery system capable of understanding a deviation in salt concentration in an electrolyte.

2. Description of Related Art

As described in Japanese Patent Application Publication No. 2010-060406 (JP 2010-060406 A), it is known that a deviation in salt concentration in an electrolyte causes an increase in internal resistance value of a secondary battery. In JP 2010-060406 A, it is recognized that, when the difference between an estimated current density estimated from a battery model and a measured current density measured by a current measurement unit (current sensor) becomes larger, the deviation in salt concentration becomes larger, and the internal resistance value of the secondary battery becomes higher. With such recognition, the ratio of the estimated current density and the measured current density is calculated as a battery resistance increase rate.

SUMMARY OF THE INVENTION

In JP 2010-060406 A, the condition (the difference between the estimated current density and the measured current density) when the deviation in salt concentration becomes larger is merely recognized, and a factor for the generation of the deviation in salt concentration is not recognized. Furthermore, in JP 2010-060406 A, the deviation in salt concentration is merely understood indirectly based on the difference between the estimated current density and the measured current density. The inventors have found that the deviation in alt concentration is generated with change (expansion and contraction) in volume of the electrolyte. According to this finding, it is possible to directly understand the deviation in salt concentration in the electrolyte.

A battery system according to an aspect of the invention includes a secondary battery, a temperature sensor and a controller. The secondary battery includes a power generation element configured to perform charging and discharging, an electrolyte, and a battery case. The electrolyte is impregnated inside the power generation element. The power generation element and the electrolyte is housed in the battery case. The temperature sensor is configured to specify a temperature of the secondary battery. The controller is configured to calculate a deviation in salt concentration in the electrolyte. The controller is configured to calculate a first flow velocity and a second flow velocity at each position in the power generation element in the flow direction of the electrolyte using an equation defining the flow of the electrolyte. The first flow velocity is a flow velocity when the electrolyte flows from an inside of the power generation element toward an outside of the power generation element. The second flow velocity is a flow velocity when the electrolyte flows from the outside of the power generation element toward the inside of the power generation element. The equation includes, as a parameter, a density of the electrolyte. The density is specified from the temperature. The density changes according to the temperature of the secondary battery. The controller is configured to calculate a salt concentration distribution in the power generation element based on the first flow velocity and the second flow velocity.

When calculating the flow velocity of the electrolyte, an equation including the density of the electrolyte as a parameter (variable) is used. The density of the electrolyte changes according to the temperature of the secondary battery. For this reason, the density of the electrolyte is specified from the temperature of the secondary battery specified using a temperature sensor. Specifying the temperature of the secondary battery includes detecting the temperature of the secondary battery using the temperature sensor and estimating the temperature of the secondary battery.

When estimating the temperature of the secondary battery, while the heat generation amount and the heat radiation amount of the secondary battery may be taken into consideration, since the heat generation amount and the heat radiation amount become the temperature variation of the secondary battery, it is necessary to detect a temperature (reference temperature) to be a reference of the temperature variation by the temperature sensor. The reference temperature is the temperature of the secondary battery when the secondary battery does not generate or radiate heat. The reference temperature can be specified by detecting the temperature of the secondary battery using the temperature sensor. When the secondary battery does not generate or radiate heat, the temperature of the secondary battery becomes equal to the temperature (environmental temperature) in the atmosphere. For this reason, the reference temperature may be specified by detecting the temperature in the atmosphere using the temperature sensor. With this, it is possible to estimate the current temperature of the secondary battery based on the temperature detected by the temperature sensor and the heat generation amount and the heat radiation amount of the secondary battery.

The deviation in salt concentration is generated by the flow of the electrolyte from the inside of the power generation element toward the outside of the power generation element and the flow of the electrolyte from the outside of the power generation element toward the inside of the power generation element. It is understood that such flow of the electrolyte is generated by change (expansion and contraction) in volume of the electrolyte. The change in volume of the electrolyte depends on the temperature of the secondary battery and is defined by the density of the electrolyte which changes according to the temperature of the secondary battery. For this reason, if the flow velocity of the electrolyte is calculated using the equation including the density of the electrolyte as a parameter, it is possible to understand the deviation in salt concentration (that is, salt concentration distribution) which is generated by the change in volume of the electrolyte.

The battery system according to the above aspect, the power generation element may include electrode plates including an active material. The equation may include, as a parameter, the density and a volume fraction of the electrolyte in the power generation element. The controller may be configured to specify a volume expansion rate of the active material based on at least one of the temperature and a state of charge of the secondary battery, when the flow velocity is calculated using the equation. The controller may be configured to calculate a variation of the volume fraction based on the volume expansion rate. The controller may specify the volume fraction based on the variation.

Since the change in volume of the active material can be specified by the volume expansion rate of the active material, it is possible to calculate the variation of the volume fraction based on the volume expansion rate of the active material. The volume expansion rate of the active material can be specified based on at least one of the temperature and the state of charge (SOC) of the secondary battery. If the variation of the volume fraction is calculated, it is possible to understand the volume fraction, and if the volume fraction is substituted in the equation, it is possible to calculate the flow velocity. If the flow velocity is calculated, as described above, it is possible to understand the salt concentration distribution.

If the change in volume of the active material is generated, there is a case where the volume of the power generation element changes with the change in volume. If the volume of the power generation element changes, the volume of a space where the electrolyte exists in the power generation element changes. As described above, while the density of the electrolyte or the volume fraction is included in the equation as a parameter, the volume of the space where the electrolyte exists is not included as a parameter. However, if the volume of the space where the electrolyte exists changes, the volume fraction of the electrolyte in the power generation element changes.

Accordingly, the battery system according to the above aspect, the controller may be configured to calculate a volume variation of a space where the electrolyte exists in the power generation element based on the volume expansion rate of the active material, when a volume of the power generation element changes according to change in volume of the active material. The controller may be configured to calculate a variation of the volume fraction for use in the equation based on the volume variation.

With this, it is possible to reflect the volume variation of the space where the electrolyte exits in the variation of the volume fraction and to calculate the flow velocity of the electrolyte using the equation including the density of the electrolyte and the volume fraction as a parameter.

The battery system according to the above aspect, the controller may be configured to calculate the salt concentration distribution in the power generation element based on the first flow velocity and the second flow velocity at each position and a production amount of salt in the electrolyte accompanied with charging and discharging of the power generation element. The battery system according to the above aspect, the controller may be configured to calculate the salt concentration distribution in the power generation element based on the first flow velocity and the second flow velocity at each position, the production amount of salt in the electrolyte accompanied with charging and discharging of the power generation element, and a diffusion state of salt in the electrolyte.

In a state where the salt concentration distribution (fluctuation) is generated, the flow of the electrolyte is generated, and thus, the salt concentration distribution changes. If the production amount of salt or the diffusion state of salt is understood, it is possible to understand the salt concentration distribution. It is possible to calculate the salt concentration distribution due to the flow (flow velocity) of the electrolyte by taking into consideration the flow velocity of the electrolyte to the salt concentration distribution.

The internal resistance value of the secondary battery increases with the deviation in salt concentration in the electrolyte impregnated into the power generation element. Accordingly, if the salt concentration distribution is calculated as described above, it is possible to calculate the resistance increase amount.

The battery system according to the above aspect, the controller may be configured to calculate a resistance increase amount corresponding to at least one of a maximum difference and an average value specified from the salt concentration distribution in the power generation element using a predetermined correspondence relationship. The predetermined correspondence relationship may be a correspondence relationship between a resistance increase amount when an internal resistance value of the secondary battery increases with the deviation in salt concentration in the electrolyte and at least one of the maximum difference and the average value in the salt concentration distribution.

A battery system according to another aspect of the invention includes a secondary battery including a power generation element configured to perform charging and discharging, an electrolyte, and a battery case. The electrolyte is impregnated inside the power generation element. The power generation element and the electrolyte are housed in the battery case. The controller is configured to calculate the flow velocity of the electrolyte moving inside the power generation element. The flow velocity is a flow velocity at different positions in a predetermined direction inside the power generation element and the predetermined direction is the moving direction of the electrolyte. The controller is configured to calculate a salt concentration distribution of the electrolyte in the predetermined direction based on the flow velocity.

The battery system according to the above aspect, the flow velocity may be a flow velocity when the electrolyte or the power generation element expands.

The battery system according to the above aspect, the flow velocity may be a flow velocity when the electrolyte or the power generation element contracts.

The battery system according to the above aspect, the flow velocity may be a flow velocity when the electrolyte or the power generation element expands and a flow velocity when the electrolyte or the power generation element contracts.

The battery system according to the above aspect, the secondary battery may further include an internal resistance. The controller may be configured to calculate an increase amount of the internal resistance based on the salt concentration distribution.

The battery system according to the above aspect, the controller may be configured to calculate the flow velocity using an equation. The equation may include, as a parameter, a density of the electrolyte or a volume change rate of the power generation element.

The battery system according to the above aspect, the controller may be configured to calculate the temperature of the secondary battery or the state of charge of the secondary battery, and may calculate the density based on the temperature or the state of charge

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an example of the invention will be described.

A battery system of the invention will be described referring to FIG. 1. A secondary battery 10 is connected to a load 20 through a positive electrode line PL and a negative electrode line NL. The load 20 operates with power output from the secondary battery 10. The load 20 can generate electric power, and the electric power produced by the load 20 is supplied to the secondary battery 10. With this, the secondary battery 10 is charged.

Figure 1:
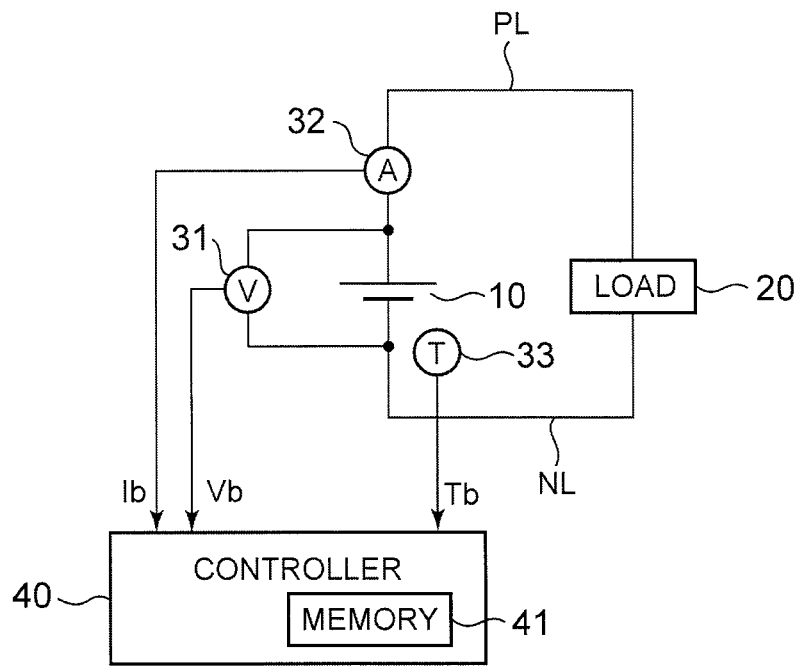
FIG. 1 is a diagram showing the configuration of a battery system.

The battery system shown in FIG. 1 can be mounted in, for example, a vehicle. In this case, an assembled battery with a plurality of secondary batteries 10 connected in series can be mounted in the vehicle. As the load 20, a motor generator can be used. The motor generator receives electric power output from the secondary battery 10 and produces power for enabling the vehicle to travel. The power produced by the motor generator is transmitted to the wheels. The motor generator can convert kinetic energy generated when braking the vehicle to electric power, and can supply the electric power to the secondary battery 10.

A voltage sensor 31 detects a voltage value Vb of the secondary battery 10 and outputs the detection result to a controller 40. A current sensor 32 detects a current value Ib of the secondary battery 10 and outputs the detection result to the controller 40. In this example, the current value Ib when the secondary battery 10 is discharged becomes a positive value, and the current value Ib when the secondary battery 10 is charged becomes a negative value.

The controller 40 can control the charging and discharging of the secondary battery 10 based on the voltage value Vb and the current value Ib. The controller 40 can calculate the state of charge (SOC) of the secondary battery 10 based on the voltage value Vb or the current value Ib. The SOC is the ratio of a current charge capacity to a full charge capacity. As a method of calculating the SOC, since a known method can be appropriately used, detailed description of the method of calculating the SOC will be omitted.

A temperature sensor 33 detects the temperature (battery temperature) Tb of the secondary battery 10 and outputs the detection result to the controller 40. The controller 40 has a memory 41. The memory 41 stores information which is used when the controller 40 performs predetermined processing (in particular, processing which will be described in this example). The memory 41 may be provided outside the controller 40.

Figure 2:
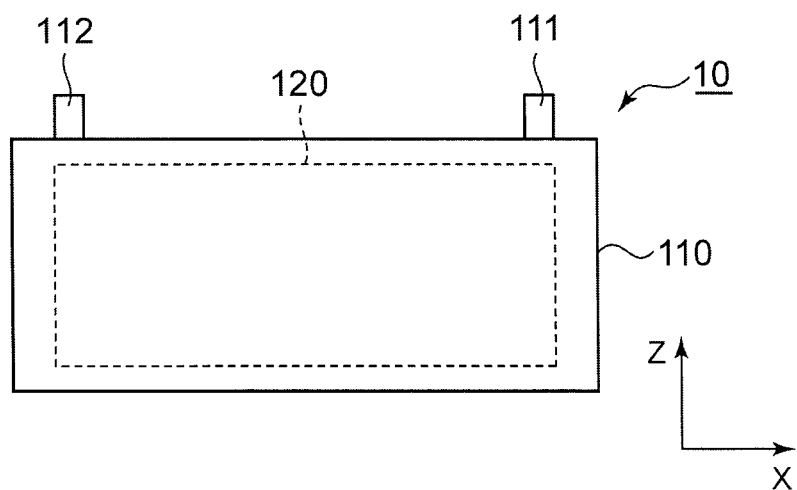
FIG. 2 is a diagram showing the configuration of a secondary battery.

Next, the structure of the secondary battery 10 will be described referring to FIG. 2. In FIG. 2, the X axis and the Z axis are axes orthogonal to each other. In this example, an axis corresponding to a vertical direction is denoted as the Z axis. An axis orthogonal to the X axis and the Z axis is denoted as the Y axis.

The secondary battery 10 has a battery case 110 and a power generation element 120. The battery case 110 houses the power generation element 120. The battery case 110 is in a sealed state, and an electrolyte is injected inside the battery case 110. A negative electrode terminal 111 and a positive electrode terminal 112 are fixed in the battery case 110. The negative electrode terminal 111 and the positive electrode terminal 112 are electrically connected to the power generation element 120.

Figure 3:
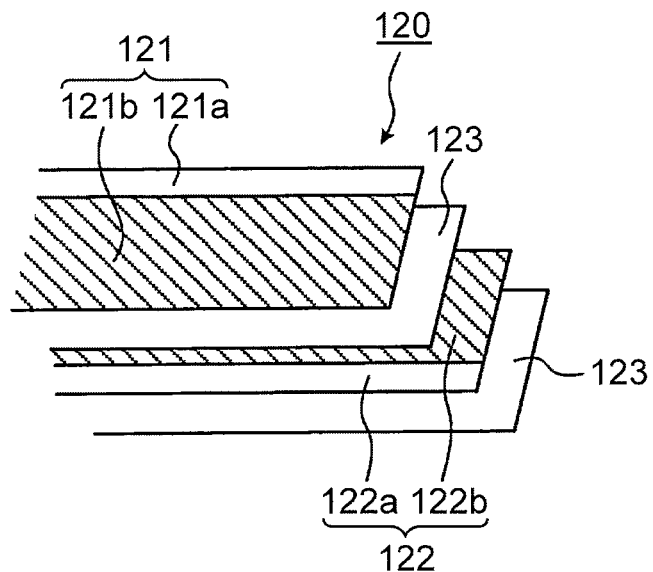
FIG. 3 is a development diagram of a power generation element.

The power generation element 120 is an element which performs charging and discharging, and as shown in FIG. 3, has a negative electrode plate (corresponding to an electrode plate of the invention) 121, a positive electrode plate (corresponding to an electrode plate of the invention) 122, and a separator 123. FIG. 3 is a development diagram of a part of the power generation element 120. The negative electrode plate 121 has a current collector foil 121a, and a negative electrode active material layer 121b formed on the surface of the current collector foil 121a. The negative electrode active material layer 121b contains a negative electrode active material, a conducting agent, a binder, and the like. The negative electrode active material layer 121b is formed in a partial area of the current collector foil 121a, and the negative electrode active material layer 121b is not formed in the remaining area of the current collector foil 121a.

The positive electrode plate 122 has a current collector foil 122a, and a positive electrode active material layer 122b formed on the surface of the current collector foil 122a. The positive electrode active material layer 122b contains a positive electrode active material, a conducting agent, a binder, and the like. The positive electrode active material layer 122b is formed in a partial area of the current collector foil 122a, and the positive electrode active material layer 122b is not formed in the remaining area of the current collector foil 122a.

The electrolyte is impregnated into the negative electrode active material layer 121b, the positive electrode active material layer 122b, and the separator 123. The electrolyte exists inside the power generation element 120. An electrolyte as a surplus liquid exists outside the power generation element 120, in other words, in a space formed between the power generation element 120 and the battery case 110.

Figure 4:
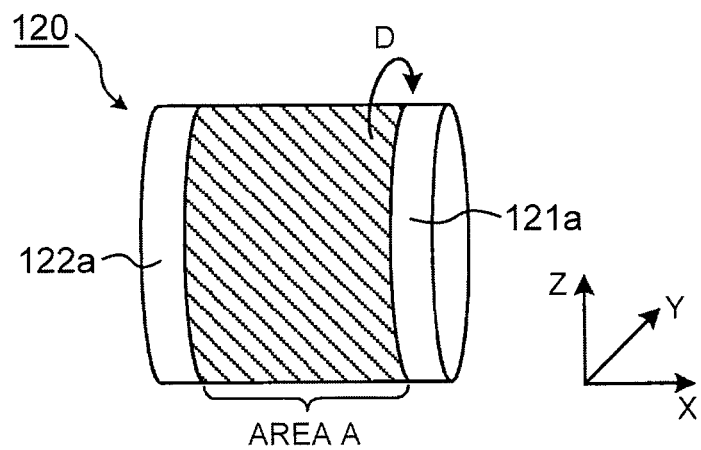
FIG. 4 is an appearance diagram of the power generation element.

The negative electrode plate 121, the positive electrode plate 122, and the separator 123 are laminated in order as shown in FIG. 3, and the laminate is wound around the X axis in a direction of an arrow D shown in FIG. 4. In this way, the power generation element 120 is constituted. The separator 123 is arranged between the negative electrode plate 121 and the positive electrode plate 122.

At one end of the power generation element 120 in the extension direction (referred to as an X direction) of the X axis, only the current collector foil 121a of the negative electrode plate 121 is wound. A portion where only the current collector foil 121a is wound is electrically connected to the negative electrode terminal 111 shown in FIG. 2. At the other end of the power generation element 120 in the X direction, only the current collector foil 122a of the positive electrode plate 122 is wound. A portion where only the current collector foil 122a is wound is electrically connected to the positive electrode terminal 112 shown in FIG. 2.

In this example, as described above, although the laminate is wound to constitute the power generation element 120, the invention is not limited thereto. Specifically, the negative electrode plate 121, the positive electrode plate 122, and the separator 123 may be merely laminated to constitute the power generation element 120 without winding the laminate.

An area A shown in FIG. 4 is an area where the negative electrode active material layer 121b and the positive electrode active material layer 122b face each other with the separator 123 sandwiched therebetween. In the area A, a chemical reaction according to the charging and discharging of the secondary battery 10 (power generation element 120) is performed.

In the secondary battery 10, the generation of a deviation in salt concentration in the electrolyte causes an increase in the internal resistance value of the secondary battery 10. The increase amount of the internal resistance value is referred to as a resistance increase amount Rh. The resistance increase amount Rh is different from the increase amount of the internal resistance value accompanied with deterioration of the secondary battery 10. The increase amount of the internal resistance value accompanied with deterioration merely increases, and does not decrease. Since the resistance increase amount Rh depends on the deviation in salt concentration, when the salt concentration is deviated, the resistance increase amount Rh increases, and when the deviation in salt concentration is relaxed, the resistance increase amount Rh decreases.

Figure 5:
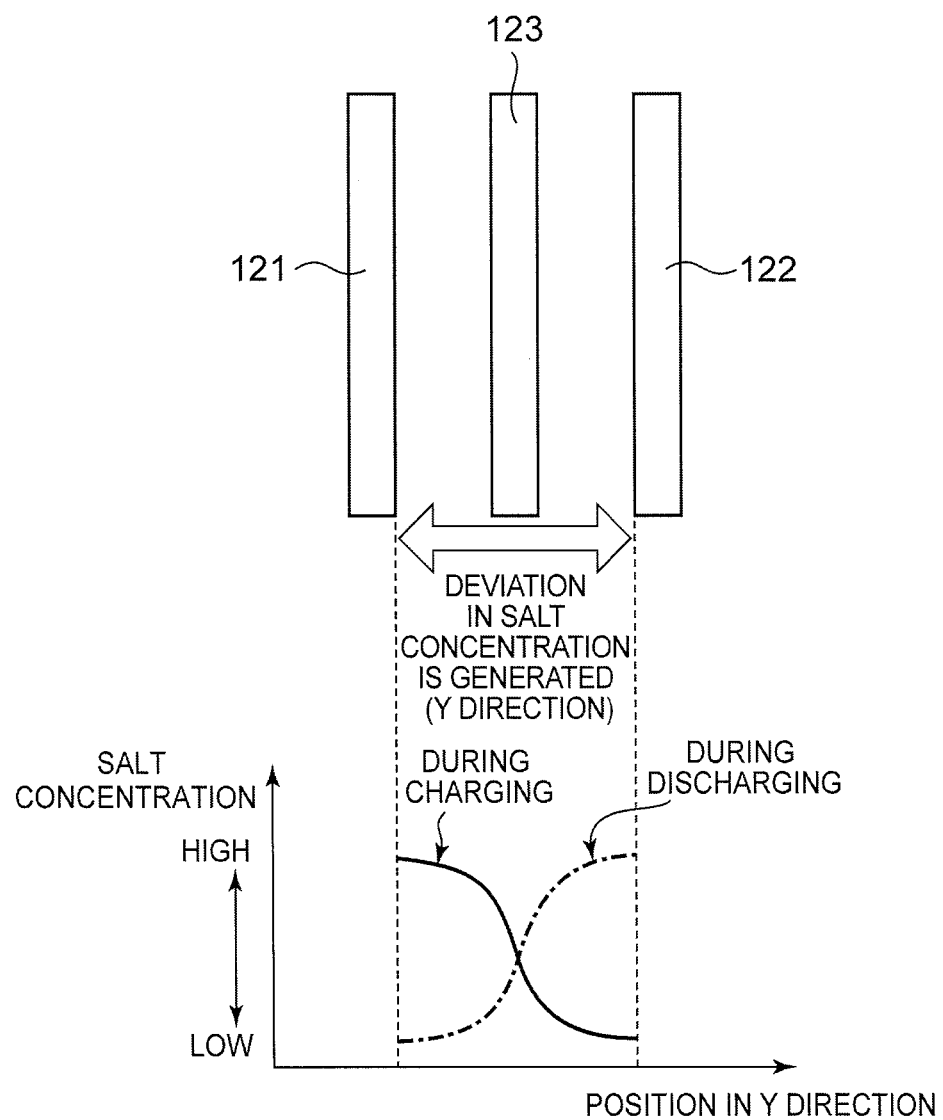
FIG. 5 is a diagram illustrating a deviation in salt concentration in a direction in which a negative electrode plate and a positive electrode plate are opposed to each other.
Figure 6:
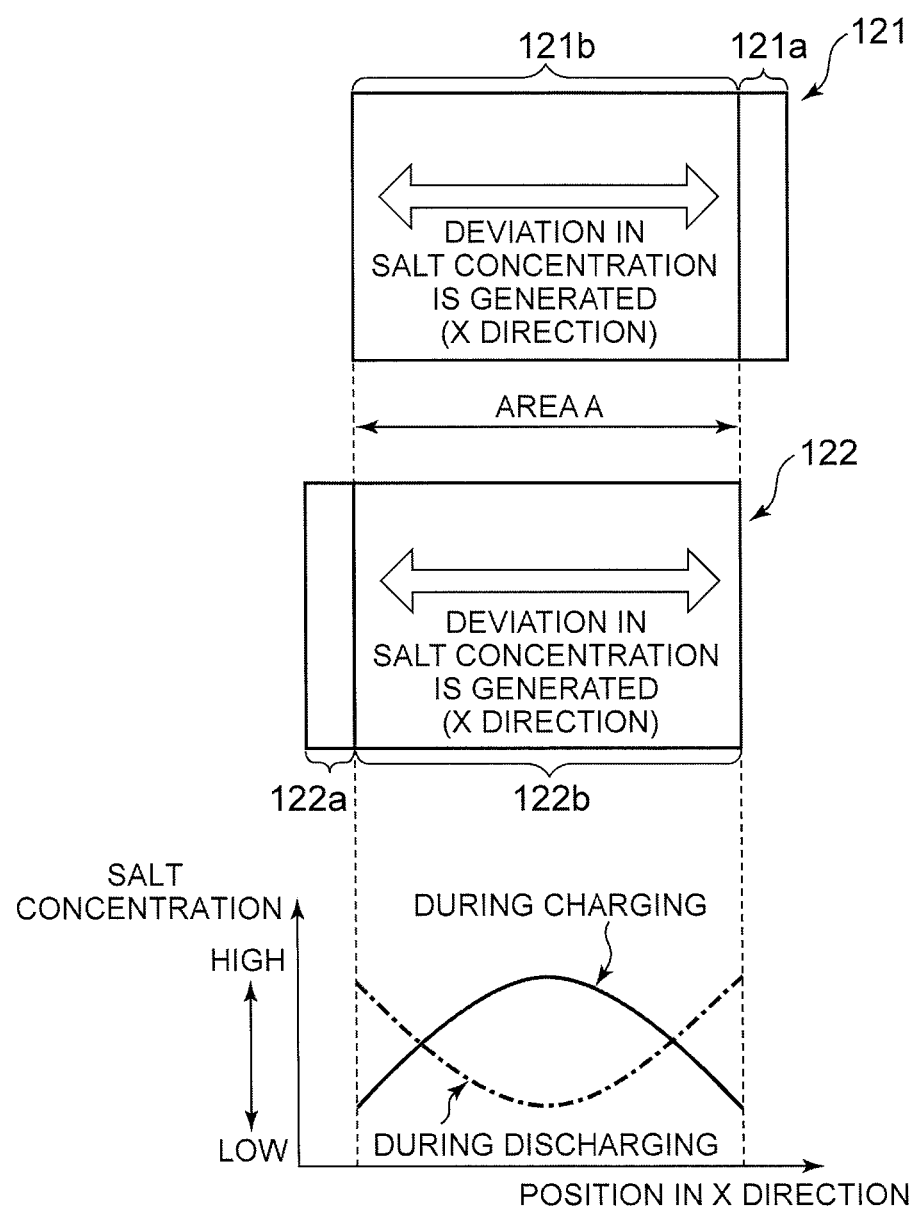
FIG. 6 is a diagram illustrating a deviation in salt concentration on the surface of each of the negative electrode plate and the positive electrode plate.

As the state of the deviation in salt concentration, there are states shown in FIGS. 5 and 6. FIG. 5 shows a state where a deviation in salt concentration is generated in a direction (Y direction) in which the negative electrode plate 121 and the positive electrode plate 122 are opposed to each other. FIG. 5 is a schematic view (an upper view of FIG. 5) showing the positional relationship of the negative electrode plate 121, the positive electrode plate 122, and the separator 123, and a diagram (a lower view of FIG. 5) showing a salt concentration distribution (an example).

In the diagram showing the salt concentration distribution, the vertical axis represents a salt concentration, and the horizontal axis represents a position in the Y direction. In FIG. 5 (upper view), although the negative electrode plate 121 and the positive electrode plate 122 are away from the separator 123, practically, the negative electrode plate 121 and the positive electrode plate 122 are in contact with the separator 123. As shown in FIG. 5 (lower view), during the charging of the secondary battery 10, there is a case where a salt concentration distribution indicated by a solid line is generated as a deviation in salt concentration. During the discharging of the secondary battery 10, there is a case where a salt concentration distribution indicated by a one-dot-chain line is generated as a deviation in salt concentration.

In FIG. 5, although the deviation in salt concentration in the Y direction is shown, the invention is not limited thereto. As described above, in the power generation element 120 of this example, since the negative electrode plate 121 and the positive electrode plate 122 are wound around the X axis, the same deviation in salt concentration as FIG. 5 is generated in the direction in which the negative electrode plate 121 (negative electrode active material layer 121b) and the positive electrode plate 122 (positive electrode active material layer 122b) are opposed to each other.

When the charging and discharging of the secondary battery 10 are performed, salt is transferred between the negative electrode plate 121 and the positive electrode plate 122 in the direction (for example, the Y direction shown in FIG. 5) in which the negative electrode plate 121 and the positive electrode plate 122 are opposed to each other. When the secondary battery 10 is a lithium-ion secondary battery, the salt becomes lithium salt. The transfer of the salt in the direction in which the negative electrode plate 121 and the positive electrode plate 122 are opposed to each other causes the generation of a deviation in salt concentration in the direction in which the negative electrode plate 121 and the positive electrode plate 122 are opposed to each other.

FIG. 6 shows a state where a deviation in salt concentration is generated on the surface (inside the area A) of each of the negative electrode plate 121 and the positive electrode plate 122. The deviation in salt concentration shown in FIG. 6 is generated in response to the generation of the deviation in salt concentration shown in FIG. 5. In FIG. 6, a part of the negative electrode plate 121 including the area A and a part of the positive electrode plate 122 including the area A are shown separately on the upper and lower sides. A part of the negative electrode plate 121 and a part of the positive electrode plate 122 are opposed to each other with the separator 123 sandwiched therebetween.

As indicated by an arrow of FIG. 6, the deviation in salt concentration is easily generated in the X direction inside the area A. FIG. 6 shows a salt concentration distribution (an example) inside the area A in each of the negative electrode plate 121 and the positive electrode plate 122. In the diagram showing the salt concentration distribution, the vertical axis represents a salt concentration, and the horizontal axis represents a position in the X direction. During the charging of the secondary battery 10, there is a case where a salt concentration distribution indicated by a solid line is generated as a deviation in salt concentration. During the discharging of the secondary battery 10, there is a case where a salt concentration distribution indicated by a one-dot-chain line is generated as a deviation in salt concentration.

As described above, at both end portions of the power generation element 120 in the X direction, the negative electrode plate 121 (current collector foil 121a) or the positive electrode plate 122 (current collector foil 122a) is merely wound around the X axis. For this reason, the electrolyte easily passes through both end portions of the power generation element 120 in the X direction. In other words, the electrolyte easily moves from the inside of the power generation element 120 toward the outside of the power generation element 120, or the electrolyte easily moves from the outside of the power generation element 120 toward the inside of the power generation element 120.

With this, as shown in FIG. 6, the deviation in salt concentration is easily generated in the X direction inside the area A. As described above, even in a configuration in which the negative electrode plate 121, the positive electrode plate 122, and the separator 123 are merely laminated, the electrolyte easily moves from the inside of the power generation element 120 toward the outside of the power generation element 120, or the electrolyte easily moves from the outside of the power generation element 120 toward the inside of the power generation element 120.

Figure 7:
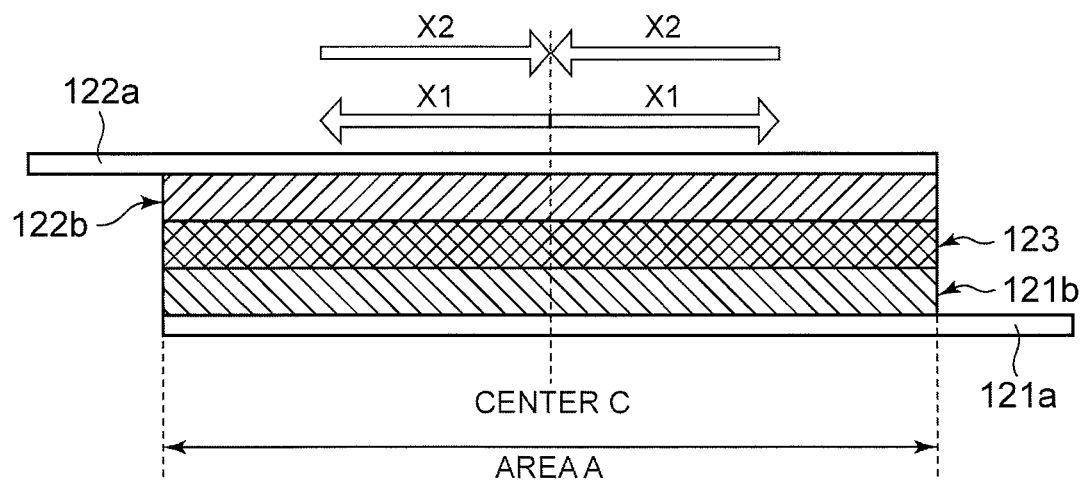
FIG. 7 is a diagram illustrating the flow direction of an electrolyte by expansion and contraction of the electrolyte.

It is understood that the deviation in salt concentration shown in FIG. 6 is generated by the flow of the electrolyte. It is also understood that the flow of the electrolyte is generated by change (expansion and contraction) in volume of the electrolyte. Specifically, if the electrolyte expands, the flow of the electrolyte is generated from the inside of the power generation element 120 toward the outside of the power generation element 120 in the X direction. That is, in FIG. 7, the electrolyte flows in a direction indicated by an arrow X1 based on a center C of the area A in the X direction. If the electrolyte contracts, the flow of the electrolyte is generated from the outside of the power generation element 120 toward the inside of the power generation element 120 in the X direction. That is, in FIG. 7, the electrolyte flows in a direction (a direction indicated by an arrow X2) toward the center C of the area A. The flow of the electrolyte in the directions indicated by the arrows X1, X2 causes the generation of the deviation in salt concentration shown in FIG. 6.

Accordingly, in this example, the deviation in salt concentration (salt concentration distribution) shown in FIG. 6 is understood by calculating the flow (flow velocity) of the electrolyte generated by expansion and contraction of the electrolyte. If the deviation in salt concentration shown in FIG. 6 is understood, for example, it is possible to understand the resistance increase amount Rh which is generated by the deviation in salt concentration. A salt concentration distribution in the invention is the salt concentration distribution shown in FIG. 6.

Hereinafter, a method of calculating the flow (flow velocity) of the electrolyte will be described.

Expression (1) is an equation which defines the flow of the electrolyte, and is known as the Brinkman-Navier-Stokes equation. Expression (2) is a continuity expression relating to the flow of the electrolyte, and is an expression which is derived from the law of conservation of mass. Expressions (1), (2) correspond to an equation of the invention.

[Equation 1]

$$\varepsilon_{e,j}\frac{\partial u_s}{\partial t} + \varepsilon_{e,j}(u_j \cdot \nabla)u_j = \frac{1}{\rho}(\mu\nabla^2 u_j - \mu K_j^{-1} u_j - \nabla p) \quad (1)$$

$$\frac{\partial(\rho\varepsilon_{e,j})}{\partial t} + \nabla \cdot (\rho u_j) = 0 \quad (2)$$

In Expressions (1), (2), $u_j$ denotes the flow velocity of the electrolyte, $\rho$ denotes the density of the electrolyte, $\varepsilon_{e,j}$ denotes the volume fraction of the electrolyte, and t denotes time. In Expression (1), $\mu$ is viscosity of the electrolyte, $K_j$ is a transmission coefficient, and p is the pressure of the electrolyte.

A subscript j is used so as to distinguish among the negative electrode plate 121, the positive electrode plate 122, and the separator 123, and examples of the subscript j include "n", "p", and "s". When the subscript j is "n", this represents a value relating to the negative electrode plate 121, when the subscript j is "p", this represents a value relating to the positive electrode plate 122, and when the subscript j is "s", this represents a value relating to the separator 123.

As described above, the electrolyte is impregnated into each of the negative electrode plate 121 (negative electrode active material layer 121b), the positive electrode plate 122 (positive electrode active material layer 122b), and the separator 123. For this reason, parameters (flow velocity $u_j$, volume fraction $\varepsilon_{e,j}$, transmission coefficient $K_j$) relating to the electrolyte are defined in each of the negative electrode plate 121, the positive electrode plate 122, and the separator 123. In this specification, there is a case where the subscript j is used other than the parameters in Expressions (1), (2).

As the viscosity $\mu$, a prescribed fixed value can be used or the viscosity $\mu$ may be varied according to the temperature of the electrolyte. As the temperature of the electrolyte, the battery temperature Tb which is detected by the temperature sensor 33 is used. If information (map or calculation expression) representing the correspondence relationship between the viscosity $\mu$ and the battery temperature Tb is prepared in advance by an experiment or the like, it is possible to specify the viscosity $\mu$ by detecting the battery temperature Tb. Information representing the correspondence relationship between the viscosity $\mu$ and the battery temperature Tb is stored in the memory 41.

The density $\rho$ is a parameter which defines expansion and contraction of the electrolyte, and represents a value according to expansion and contraction of the electrolyte. Expansion and contraction of the electrolyte depend on the temperature (that is, battery temperature Tb) of the electrolyte, and the density $\rho$ also depends on the temperature (battery temperature Tb) of the electrolyte. Accordingly, if information (map or calculation expression) representing the correspondence relationship between the density $\rho$ and the battery temperature Tb is prepared in advance by an experiment or the like, it is possible to specify the density $\rho$ by detecting the battery temperature Tb. It is possible to understand expansion and contraction of the electrolyte by specifying the density $\rho$. Information representing the correspondence relationship between the density $\rho$ and the battery temperature Tb is stored in the memory 41. As the volume fraction $\varepsilon_{e,j}$ or the transmission coefficient $K_j$, a prescribed fixed value can be used.

In Expression (1), since the flow velocity $u_j$ and the pressure p are unknown numbers, the flow velocity $u_j$ and the pressure p can be calculated by defining the continuity expression of Expression (2) and solving a simultaneous equation of Expressions (1), (2). Since Expressions (1), (2) include the density $\rho$ which defines expansion and contraction of the electrolyte, the flow velocity $u_j$ according to expansion and contraction of the electrolyte can be calculated by solving the simultaneous equation of Expressions (1), (2). The flow velocity $u_j$ includes a flow velocity in the direction indicated by the arrow X1 of FIG. 7 and a flow velocity in the direction indicated by the arrow X2 of FIG. 7. When calculating the flow velocity $u_j$, for example, convergent calculation can be performed using Expressions (1), (2). Although the calculation using Expressions (1), (2) is performed in a predetermined cycle, the flow velocity $u_j$ can be calculated using a value calculated in a previous calculation cycle in a present calculation cycle.

In the negative electrode plate 121, the electrolyte moves inside the negative electrode active material layer 121b. For this reason, the flow velocity $u_j$ (that is, a flow velocity $u_n$) is calculated at each position inside the negative electrode active material layer 121b. When understanding the deviation in salt concentration shown in FIG. 6, the flow velocity $u_n$ is calculated at different positions in the X direction.

In the positive electrode plate 122, the electrolyte moves inside the positive electrode active material layer 122b. For this reason, the flow velocity $u_j$ (that is, a flow velocity $u_p$) is calculated at each position inside the positive electrode active material layer 122b. When understanding the deviation in salt concentration shown in FIG. 6, the flow velocity $u_p$ is calculated at different positions in the X direction. In the separator 123, the electrolyte moves inside thereof. For this reason, the flow velocity $u_j$ (that is, a flow velocity $u_s$) is calculated at each position inside the separator 123. When understanding the deviation in salt concentration shown in FIG. 6, the flow velocity $u_s$ is calculated at different positions in the X direction.

If various conditions are assumed in Expressions (1), (2), Expression (1) may be simplified. Hereinafter, a method when simplifying Expression (1) (an example) will be described.

If it is assumed that the density $\rho$ of the electrolyte is constant regardless of the position (including the position in the X direction) at which the flow velocity $u_j$ is calculated, Expression (2) is expressed by Expression (3).

[Equation 2]

$$\frac{\partial(\rho\varepsilon_{e,j})}{\partial t} + \rho\nabla \cdot u_j = 0 \tag{3}$$

Expression (4) is derived from Expression (3). In Expression (4), $v_p$, $v_n$, and $v_s$ are kinematic viscosity coefficients ($v=\mu/\rho$) of the electrolyte in the positive electrode plate 122, the negative electrode plate 121, and the separator 123. In Expression (4), x and y respectively represent positions in the X direction and the Y direction. The Y direction is the direction (an up-down direction of FIG. 7) in which the negative electrode plate 121 and the positive electrode plate 122 are opposed to each other with the separator 123 sandwiched therebetween.

[Equation 3]

$$\frac{\partial(\rho(\varepsilon_{e,p}+\varepsilon_{e,n}+\varepsilon_{e,s}))}{\partial t} + \rho\left(\frac{\partial(u_p+u_n+u_s)}{\partial x} + \frac{\partial(v_p+v_n+v_s)}{\partial y}\right) = 0 \tag{4}$$

Taking the continuity of the electrolyte into consideration, Expression (4) is expressed by Expression (5).

[Equation 4]

$$\frac{\partial(\rho(\varepsilon_{e,p}+\varepsilon_{e,n}+\varepsilon_{e,s}))}{\partial t} + \rho\left(\frac{\partial(u_p+u_n+u_s)}{\partial x}\right) = 0 \tag{5}$$

In Expression (1), if the assumption of Expression (6) is made, Expression (7) is obtained.

[Equation 5]

$$\left.\begin{array}{l}\frac{\partial u_j}{\partial t} \approx 0 \\ \varepsilon_{e,j}(u_j \cdot \nabla)u_j \approx 0 \\ \mu\nabla^2 u_j \approx 0\end{array}\right\} \tag{6}$$

$$-\mu K_j^{-1} u_j - \nabla p = 0 \tag{7}$$

In regard to the pressure distribution of the electrolyte in the X direction, if it is assumed that the negative electrode plate 121, the positive electrode plate 122, and the separator 123 have the same pressure distribution, Expression (8) is obtained.

[Equation 6]

$$\frac{\partial p}{\partial x} = -\mu K_p^{-1} u_p = -\mu K_n^{-1} u_n = -\mu K_s^{-1} u_s \tag{8}$$

According to Expressions (5), (8), Expression (9) is derived. Expression (9) represents the flow velocity $u_n$ according to the position in the X direction in the negative electrode plate 121. In Expression (9), x represents the position in the X direction.

[Equation 7]

$$\frac{\partial u_n}{\partial x} = -\frac{K_n}{K_p+K_n+K_s}\frac{1}{\rho}\frac{\partial(\rho(\varepsilon_{e,p}+\varepsilon_{e,s}+\varepsilon_{e,n}))}{\partial t} \tag{9}$$

If Expression (9) is integrated with x and it is assumed that the flow velocity $u_n$ is 0 when x is 0, Expression (10) is obtained. The position when x is 0 represents one end of the area A in the X direction. If the length of the area A in the X direction is referred to as L, x becomes L at the other end of the area A in the X direction.

[Equation 8]

$$u_n = -\frac{K_n}{K_p+K_n+K_s}\frac{1}{\rho}\frac{\partial(\rho(\varepsilon_{e,p}+\varepsilon_{e,s}+\varepsilon_{e,n}))}{\partial t}x \tag{10}$$

Similarly to the flow velocity $u_n$, the flow velocities $u_p$, $u_s$ are expressed by Expressions (11), (12).

[Equation 9]

$$u_p = -\frac{K_p}{K_p+K_n+K_s}\frac{1}{\rho}\frac{\partial(\rho(\varepsilon_{e,p}+\varepsilon_{e,s}+\varepsilon_{e,n}))}{\partial t}x \tag{11}$$

$$u_s = -\frac{K_s}{K_p+K_n+K_s}\frac{1}{\rho}\frac{\partial(\rho(\varepsilon_{e,p}+\varepsilon_{e,s}+\varepsilon_{e,n}))}{\partial t}x \tag{12}$$

Expressions (10) to (12) are simplified expressions of Expression (1), and can calculate flow velocities $u_n$, $u_p$, $u_s$ according to the position in the X direction in the negative electrode plate 121, the positive electrode plate 122, and the separator 123. Expressions (10) to (12) correspond to an equation of the invention. An equation for calculating the flow velocity $u_j$ of the electrolyte is not limited to Expressions (1), (2), (10) to (12). Since the flow of the electrolyte is generated by the change in volume of the electrolyte, the invention can be applied to any equation insofar as the equation includes, as a parameter (variable), the density of the electrolyte which defines the change in volume of the electrolyte, and can define the flow of the electrolyte.

If the flow velocity $u_j$ is calculated, salt concentration $c_{e,j}$ in the electrolyte can be calculated based on Expression (13). When calculating the salt concentration $c_{e,j}$, all of the flow velocities $u_n$, $u_p$, $u_s$ may be taken into consideration, or only a part (for example, the flow velocity $u_n$) of the flow velocities $u_n$, $u_p$, $u_s$ may be taken into consideration.

[Equation 10]

$$\frac{\partial(\varepsilon_{e,j}c_{e,j})}{\partial t} + u_j \cdot \nabla\varepsilon_{e,j}c_{e,j} = \nabla\left(D_{e,j}^{eff}\nabla c_{e,j}\right) + \frac{1-t_+^0}{F}j_j \tag{13}$$

In Expression (13), $D_{e,j}^{eff}$ denotes an effective diffusion coefficient of the electrolyte, and $t_+^0$ denotes a transport number of salt in the electrolyte. F denotes the Faraday constant, and $j_j$ denotes a production amount of salt in the electrolyte per unit volume and unit time.

A first term on the left side of Expression (13) defines change in salt concentration for a predetermined time $\Delta t$. A second term on the left side of Expression (13) defines change in salt concentration which depends on the flow (flow velocity $u_j$) of the electrolyte. A first term on the right side of Expression (13) defines the diffusion state production amount of salt. During the discharging of the secondary battery 10, salt is produced on the surface (negative electrode active material layer 121*b*) of the negative electrode plate 121, and during the charging of the secondary battery 10, salt is produced on the surface (positive electrode active material layer 122*b*) of the positive electrode plate 122.

According to Expression (13), it is possible to understand the deviation in salt concentration shown in FIGS. 5 and 6. The salt concentration $c_{e,j}$ can be calculated by solving Expression (13). Since the flow velocity $u_j$ according to the position in the X direction is used as the flow velocity $u_j$, the salt concentration $c_{e,j}$ according to the position in the X direction can be calculated by solving Expression (13). With this, the distribution (see FIG. 6) of the salt concentration $c_{e,j}$ in the X direction can be calculated.

A method of calculating the salt concentration $c_{e,j}$ is not limited to the method using Expression (13). If fluctuation in salt concentration $c_{e,j}$ in the X direction is generated, the distribution of salt concentration $c_{e,j}$ in the X direction can be calculated based on the flow velocity $u_j$. In Expression (13), in order to understand fluctuation in salt concentration $c_{e,j}$, the diffusion state of salt and the production amount of salt are defined. For example, if fluctuation in salt concentration $c_{e,j}$ is set in advance, the distribution of salt concentration $c_{e,j}$ can be calculated based on the flow velocity $u_j$ without taking into consideration the diffusion state or production amount of salt.

According to Expression (13), although the diffusion state of salt in the electrolyte is defined, the diffusion state of salt may not be taken into consideration. Since a time constant relating to diffusion of salt is greater than a time constant relating to production of salt, diffusion of salt may not be generated. Accordingly, when calculating the distribution of salt concentration $c_{e,j}$, the diffusion state of salt may not be taken into consideration.

As described above, if the distribution of salt concentration $c_{e,j}$ is calculated, the maximum difference (salt concentration difference) $\Delta c_{e,j}\_max$ of the salt concentration $c_{e,j}$ can be calculated. The salt concentration difference $\Delta c_{e,j}\_max$ is the difference between salt concentration (maximum value) $c_e$ and salt concentration (minimum value) $c_e$.

Figure 8:
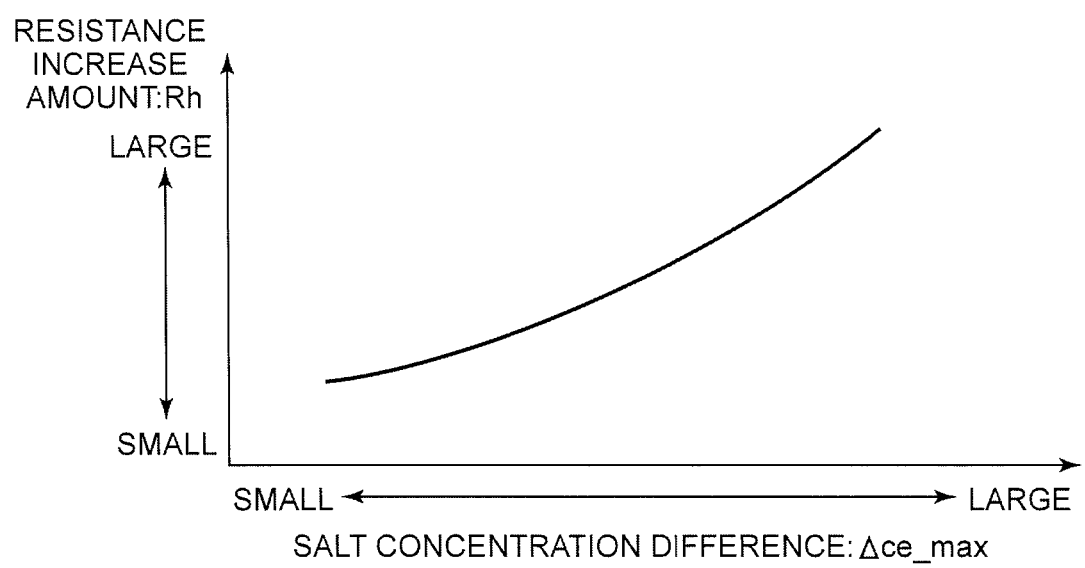
FIG. 8 is a diagram showing the relationship between a resistance increase amount and a salt concentration difference.

As shown in FIG. 8, if the correspondence relationship between the resistance increase amount Rh and the salt concentration difference $\Delta c_e\_max$ is calculated in advance by an experiment or the like, the resistance increase amount Rh corresponding to the salt concentration difference $\Delta c_e\_max$ can be calculated by calculating the salt concentration difference $\Delta c_e\_max$. As shown in FIG. 8, the larger the salt concentration difference $\Delta c_e\_max$, the larger the resistance increase amount Rh. In other words, the smaller the salt concentration difference $\Delta c_e\_max$, the smaller the resistance increase amount Rh. According to Expression (13), the salt concentration $c_e$ is calculated in each of the negative electrode plate 121 and the positive electrode plate 122. When calculating the salt concentration difference $\Delta c_e\_max$ shown in FIG. 8, first, the distributions of salt concentration $c_e$ in the negative electrode plate 121 and the positive electrode plate 122 are totaled. Specifically, the salt concentrations $c_e$ at opposing positions in the negative electrode plate 121 and the positive electrode plate 122 are totaled. In the distribution of total salt concentration $c_e$, the difference between salt concentration (maximum value) $c_e$ and salt concentration (minimum value) $c_e$ is calculated as the salt concentration difference $\Delta c_e\_max$.

The correspondence relationship between the resistance increase amount Rh and the salt concentration difference $\Delta c_e\_max$ can be expressed as a map or a calculation expression. Information for specifying the correspondence relationship can be stored in the memory 41. According to Expression (13), since the salt concentration $c_{e,j}$ is calculated each time a predetermined time (calculation cycle) $\Delta t$ elapses and the distribution of salt concentration $c_{e,j}$ can be understood, the resistance increase amount Rh is calculated each time the predetermined time $\Delta t$ elapses. Accordingly, change in the resistance increase amount Rh can be understood.

There is a case where the resistance increase amount Rh depends on average salt concentration $c_e\_ave$. Accordingly, the resistance increase amount Rh may be calculated based on the average salt concentration $c_e\_ave$. The average salt concentration $c_e\_ave$ is salt concentration (average value) obtained by averaging the distribution of salt concentration (the total value described above) $c_e$ in the negative electrode plate 121 and the positive electrode plate 122. Similarly to the salt concentration difference $\Delta c_e\_max$, if the correspondence relationship (map or calculation expression) between the resistance increase amount Rh and the average salt concentration $c_e\_ave$ is calculated in advance by an experiment or the like, the resistance increase amount Rh corresponding to the average salt concentration $c_e\_ave$ can be calculated by calculating the average salt concentration $c_e\_ave$.

The resistance increase amount Rh may be calculated based on the salt concentration difference $\Delta c_e\_max$ and the average salt concentration $c_e\_ave$. In this case, the correspondence relationship (map or calculation expression) of the salt concentration difference $\Delta c_e\_max$, the average salt concentration $c_e\_ave$, and the resistance increase amount Rh may be calculated in advance. If the salt concentration difference $\Delta c_e\_max$ and the average salt concentration $c_e\_ave$ are calculated, the resistance increase amount Rh corresponding to the calculated salt concentration difference $\Delta c_e\_max$ and average salt concentration $c_e\_ave$ can be calculated.

Figure 9:
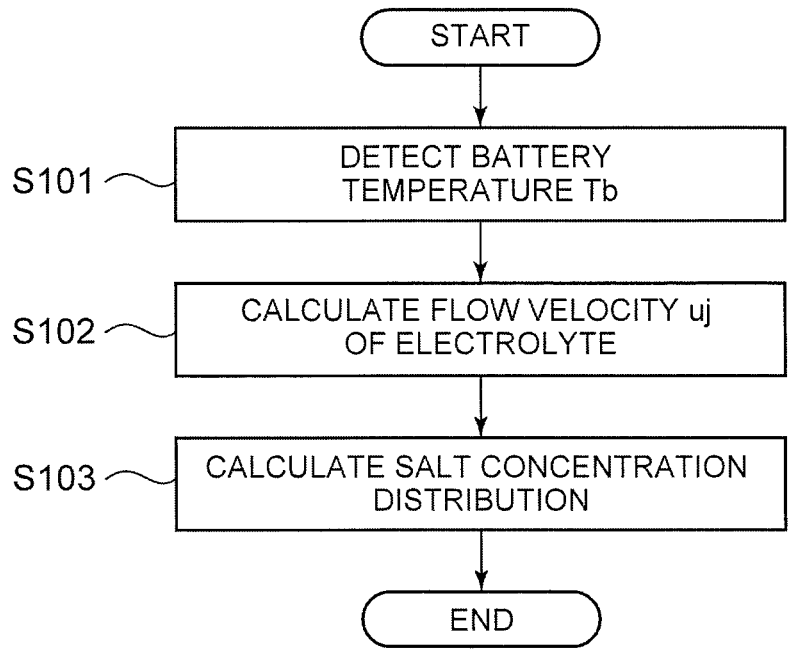
FIG. 9 is a flowchart illustrating processing for calculating a salt concentration distribution.

FIG. 9 is a flowchart showing processing for calculating a salt concentration distribution. The processing shown in FIG. 9 is executed by the controller 40.

In Step S101, the controller 40 detects the battery temperature Tb using the temperature sensor 33. In Step S102, the controller 40 calculates the flow velocity $u_j$ of the electrolyte. Specifically, as described above, the controller 40 calculates the flow velocity $u_j$ according to the position in the X direction. When calculating the flow velocity $u_j$, the battery temperature Tb detected in Step S101 is used.

In Step S103, the controller 40 calculates the distribution of salt concentration $c_{e,j}$ based on the flow velocity $u_j$ calculated in Step S102. A method of calculating the distribution of salt concentration $c_{e,j}$ is as described above.

In this example, although the battery temperature Tb is detected using the temperature sensor 33 in Step S101, the invention is not limited thereto. Specifically, in Step S101, the battery temperature Tb can be estimated taking into consideration a heat generation amount (an increase amount of the battery temperature Tb) when the secondary battery 10 is charged and discharged and a heat radiation amount (a decrease amount of the battery temperature Tb) of the secondary battery 10.

The heat generation amount of the secondary battery 10 can be calculated from the current value Ib and the internal resistance value of the secondary battery 10. The internal resistance value of the secondary battery 10 can be calculated from the current value Ib and the voltage value Vb. The heat radiation amount of the secondary battery 10 can be calculated based on the battery temperature Tb and the temperature (environmental temperature) in the atmosphere in the periphery of the secondary battery 10. When the battery temperature Tb is higher than the environmental temperature, the larger the difference between the battery temperature Tb and the environmental temperature becomes, the larger the heat radiation amount easily becomes.

If the secondary battery 10 is not charged and discharged, the battery temperature Tb becomes equal to the environmental temperature. Accordingly, the environmental temperature is detected using a temperature sensor different from the temperature sensor 33, and the current battery temperature Tb can be calculated (estimated) based on the heat generation amount which is calculated each time the secondary battery 10 is charged and discharged and the heat radiation amount of the secondary battery 10. As a method of estimating the battery temperature Tb based on the heat generation amount and the heat radiation amount, a known method can be appropriately used. When the secondary battery 10 is mounted in the vehicle, the vehicle is provided with a temperature sensor which detects the temperature outside the vehicle. The environmental temperature can be detected using the temperature sensor.

Figure 10:
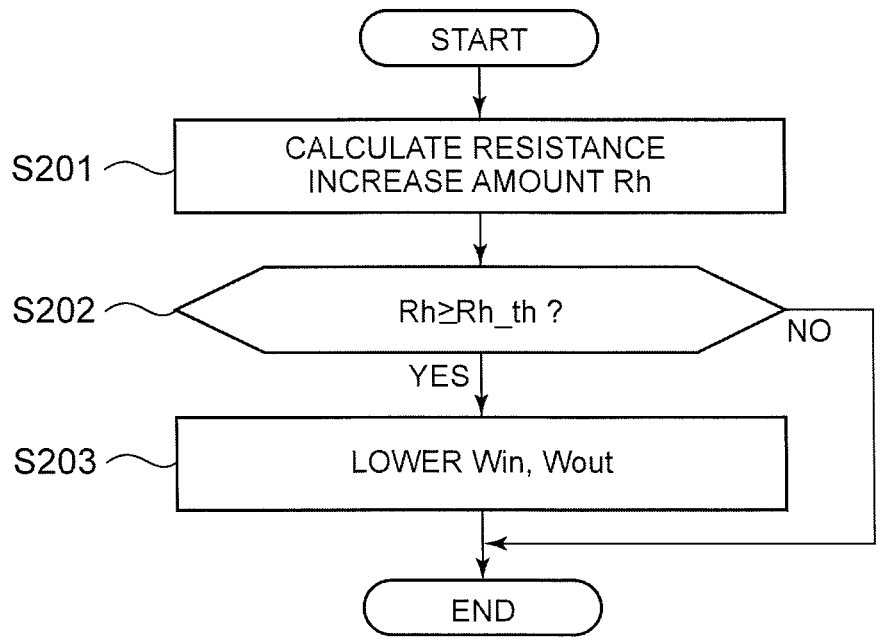
FIG. 10 is a flowchart illustrating processing for controlling charging and discharging of the secondary battery.

When the salt concentration distribution is calculated by the processing shown in FIG. 9, the resistance increase amount Rh is calculated based on the salt concentration distribution, and the charging and discharging of the secondary battery 10 can be controlled based on the resistance increase amount Rh. Processing (an example) when controlling the charging and discharging of the secondary battery 10 will be described referring to the flowchart shown in FIG. 10. The processing shown in FIG. 10 is executed by the controller 40.

In Step S201, the controller 40 calculates the resistance increase amount Rh based on the distribution of salt concentration $c_{e,j}$ calculated by the processing shown in FIG. 9. A method of calculating the resistance increase amount Rh is as described above. In Step S202, the controller 40 determines whether or not the resistance increase amount Rh is equal to or greater than a threshold value Rh_th. The threshold value Rh_th is an upper limit value of the resistance increase amount Rh, and can be appropriately set from the viewpoint of suppressing deterioration of the secondary battery 10. Information for specifying the threshold value Rh_th can be stored in the memory 41.

When the resistance increase amount Rh is equal to or greater than the threshold value Rh_th, in Step S203, the controller 40 decreases a charging power allowable value Win or a discharging power allowable value Wout. The charging power allowable value Win is an upper limit power value which permits the charging of the secondary battery 10, and the discharging power allowable value Wout is an upper limit power value which permits the discharging of the secondary battery 10.

As described above, since the current value Ib when the secondary battery 10 is charged becomes a negative value, a charging power value becomes a negative value. Since the current value Ib when the secondary battery 10 is discharged becomes a positive value, a discharging power value becomes a positive value. When the secondary battery 10 is charged, charging is controlled such that the charging power value (absolute value) is not higher than the charging power allowable value (absolute value) Win. When the secondary battery 10 is discharged, discharging is controlled such that the discharging power value is not higher than the discharging power allowable value Wout.

A charging power allowable value Win_ref or a discharging power allowable value Wout_ref as a reference value is set based on the battery temperature Tb or the SOC of the secondary battery 10. In Step S202, the charging power allowable value (absolute value) Win is decreased below the charging power allowable value (absolute value) Win_ref, or the discharging power allowable value Wout is decreased below the discharging power allowable value Wout_ref. The decrease in the charging power allowable value Win or the discharging power allowable value Wout can suppress an increase in the resistance increase amount Rh.

When the resistance increase amount Rh is smaller than the threshold value Rh_th, the controller 40 ends the processing shown in FIG. 10. At this time, the above-described charging power allowable value Win_ref is set as the charging power allowable value Win, and the above-described discharging power allowable value Wout_ref is set as the discharging power allowable value Wout.

In the processing shown in FIG. 10, although, when the resistance increase amount Rh is equal to or greater than the threshold value Rh_th, the charging power allowable value (absolute value) Win and the discharging power allowable value Wout are decreased, the invention is not limited thereto. Specifically, either the charging power allowable value (absolute value) Win or the discharging power allowable value Wout can be decreased.

As the resistance increase amount Rh, there are the resistance increase amount Rh due to the charging of the secondary battery 10 and the resistance increase amount Rh due to the discharging of the secondary battery 10. As shown in FIG. 6, the distribution of salt concentration $c_{e,j}$ is different during charging and discharging. Accordingly, if the distribution of salt concentration $c_{e,j}$ is understood, it is possible to distinguish between the resistance increase amount Rh due to the charging of the secondary battery 10 and the resistance increase amount Rh due to the discharging of the secondary battery 10.

When the salt concentration difference $\Delta c_e$_max is generated by the charging of the secondary battery 10, and the resistance increase amount Rh calculated from the salt concentration difference $\Delta c_e$_max is equal to or greater than the threshold value Rh_th, only the charging power allowable value (absolute value) Win can be decreased. With this, in regard to the resistance increase amount Rh due to charging, an increase in the resistance increase amount Rh can be suppressed or the resistance increase amount Rh can be decreased.

When the salt concentration difference $\Delta c_e$_max is generated by the discharging of the secondary battery 10, and the resistance increase amount Rh calculated from the salt concentration difference $\Delta c_e$_max is equal to or greater than the threshold value Rh_th, only the discharging power allowable value Wout can be decreased. With this, in regard to the resistance increase amount Rh due to discharging, an increase in the resistance increase amount Rh can be suppressed, or the resistance increase amount Rh can be decreased.

In this example, although the resistance increase amount Rh is calculated based on the distribution of salt concentration $c_e$, the invention is not limited thereto. That is, if the distribution of salt concentration $c_e$ is calculated as in this example, the distribution of salt concentration $c_e$ can be applied to various techniques for understanding the internal state of the secondary battery 10. As the internal state of the secondary battery 10, for example, as described below, there is an SOC or the distribution of current values.

For example, according to a technique described in Japanese Patent Application Publication No. 2013-083525 (JP 2013-083525 A), an SOC (estimated value) is calculated from an open circuit voltage (OCV) of the secondary battery 10, and the SOC (estimated value) is corrected using an SOC (correction amount). The SOC (correction amount) is calculated by multiplying a basic value specified from the SOC (estimated value) and the battery temperature Tb by a gain. The gain is set according to a deviation in salt concentration.

In JP 2013-083525 A, the gain is calculated based on a current integration value obtained by integrating the current value of the secondary battery 10 and the battery temperature Tb. That is, the gain is calculated after a salt concentration distribution is understood indirectly using the current integration value and the battery temperature Tb. If the distribution of salt concentration $c_e$ is calculated as in this example, the gain can be calculated based on the distribution of salt concentration $c_e$.

If the distribution of salt concentration $c_e$ can be understood, the distribution of current values according to the position in the X direction shown in FIG. 6 can be understood. If the salt concentration $c_e$ changes, the flowability (that is, current value) of a current changes. For this reason, the current values are different at positions (the positions in the X direction shown in FIG. 6) where the salt concentration $c_e$ is different. When the secondary battery 10 is a lithium-ion secondary battery, it is known that the more easily the current flows, the more easily lithium is precipitated. For this reason, it is considered that the precipitation state of lithium can be understood using the distribution of current values understood from the distribution of salt concentration $c_e$.

Example 2 of the invention will be described. In this example, the same components as those described in Example 1 are represented by the same reference numerals, and detailed description thereof will not be repeated. Hereinafter, description will be provided focusing on the difference from Example 1.

In Example 1, the salt concentration distribution is calculated taking into consideration the flow (flow velocity $u_j$) of the electrolyte generated by expansion and contraction of the electrolyte. There is a case where the flow of the electrolyte is generated by expansion and contraction of an active material (positive electrode active material or negative electrode active material), in addition to expansion and contraction of the electrolyte. In this example, the salt concentration distribution is calculated taking into consideration the flow (flow velocity $u_j$) of the electrolyte generated by expansion and contraction of the electrolyte and expansion and contraction of the active material.

When the active material expands, the volume of the active material increases, and when the active material contracts, the volume of the active material decreases. The volume of the active material depends on the battery temperature Tb or the SOC of the secondary battery 10. That is, if the battery temperature Tb or the SOC changes, the volume of the active material changes.

If it is assumed that the volume of the negative electrode active material layer 121b or the positive electrode active material layer 122b is not changed, change in volume of the negative electrode active material or the positive electrode active material causes change in the volume fraction $\varepsilon_{e,j}$ of the electrolyte impregnated into the active material layer 121b or 122b. Accordingly, when calculating the flow (flow velocity $u_j$) of the electrolyte, it is preferable to take into consideration the change in the volume fraction $\varepsilon_{e,j}$. The variation $\Delta\varepsilon_{e,j}$ of the volume fraction $\varepsilon_{e,j}$ can be calculated based on Expression (14).

[Equation 11]

$$\Delta\varepsilon_{e,j} = \beta_j(\varepsilon_{e,j} - 1) \quad (14)$$

In Expression (14), $\beta_j$ (specifically, $\beta_n$ or $\beta_p$) denotes a volume expansion rate of an active material (negative electrode active material or positive electrode active material), and $\varepsilon_{e,j}$ denotes a volume fraction $\varepsilon_{e,j}$ calculated in a previous calculation cycle. Since the volume expansion rate $\beta_j$ is a value which defines expansion and contraction of an active material, according to Expression (14), the variation $\Delta\varepsilon_{e,j}$ can be calculated based on the volume expansion rate $\beta_j$. When the variation $\Delta\varepsilon_{e,j}$ is calculated in a present calculation cycle, the volume fraction $\varepsilon_{e,j}$ in the present calculation cycle can be calculated by adding the present variation $\Delta\varepsilon_{e,j}$ to the previous volume fraction $\varepsilon_{e,j}$.

When first calculating the variation $\Delta\varepsilon_{e,j}$, as the volume fraction $\varepsilon_{e,j}$ in Expression (14), a value according to the battery temperature Tb or the SOC of the secondary battery 10 can be used. If information representing the correspondence relationship between at least one of the battery temperature Tb and the SOC and the volume fraction $\varepsilon_{e,j}$ is calculated in advance by an experiment or the like, the volume fraction $\varepsilon_{e,j}$ can be specified by specifying the battery temperature Tb or the SOC.

The volume expansion rate $\beta_j$ can be calculated from a linear expansion rate $\alpha_j$. That is, a value three times the linear expansion rate $\alpha_j$ becomes the volume expansion rate $\beta_j$. Since the linear expansion rate $\alpha_j$ depends on the battery temperature Tb or the SOC of the secondary battery 10, the linear expansion rate $\alpha_j$ can be specified from at least one of the battery temperature Tb and the SOC. For example, if information (map or calculation expression) representing the correspondence relationship between the linear expansion rate $\alpha_j$ and the battery temperature Tb is prepared in advance by an experiment or the like, the linear expansion rate $\alpha_j$ can be specified by detecting or estimating the battery temperature Tb. If information (map or calculation expression) representing the correspondence relationship between the linear expansion rate $\alpha_j$ and the SOC is prepared in advance by an experiment or the like, the linear expansion rate $\alpha_j$ can be specified by estimating the SOC. Information representing the correspondence relationship described above can be stored in the memory 41. The volume expansion rate $\beta_j$ may be calculated directly from at least one of the battery temperature Tb and the SOC without calculating the linear expansion rate $\alpha_j$.

In addition to the variations $\Delta\varepsilon_{e,n}$, $\Delta\varepsilon_{e,p}$ relating to the respective active material layers 121b, 122b, the variation $\Delta\varepsilon_{e,s}$ relating to the separator 123 may be calculated. When calculating the variation $\Delta\varepsilon_{e,s}$, $\beta_j$ (that is, $\beta_s$) in Expression (14) becomes a volume expansion rate of a material for forming the separator 123. The volume expansion rate $\beta_s$ depends on the battery temperature Tb. For this reason, if information (map or calculation expression) representing the correspondence relationship between the volume expansion rate $\beta_s$ and the battery temperature Tb is prepared in advance by an experiment or the like, the volume expansion rate $\beta_s$ can be specified by detecting or estimating the battery temperature Tb. In regard to the separator 123, a method of calculating the variation $\Delta\varepsilon_{e,s}$ and the volume fraction $\varepsilon_{e,s}$ is the same as the above-described calculation method.

The volume fraction $\varepsilon_{e,j}$ calculated from the variation $\Delta\varepsilon_{e,j}$ in Expression (14) is used as the volume fraction $\varepsilon_{e,j}$ in Expressions (1), (2), (10) to (13). Similarly to Example 1, the resistance increase amount Rh of the secondary battery 10 can be calculated by calculating the flow velocity $u_j$ of the electrolyte and then calculating the salt concentration distribution. In this example, when calculating the flow velocity $u_j$, in order to calculate the volume expansion rate $\beta_j$, in Step S101 shown in FIG. 9, at least one of the battery temperature Tb and the SOC is specified.

According to this example, when the flow of the electrolyte is generated by expansion and contraction of the active material, the calculation of the flow velocity $u_j$ taking into consideration the volume fraction $\varepsilon_{e,j}$ can enable improvement of the calculation accuracy of the flow velocity $u_j$. Therefore, it is possible to improve the calculation accuracy of the salt concentration distribution or to improve the calculation accuracy of the resistance increase amount Rh.

Example 3 of the invention will be described. In this example, the same components as those in Examples 1, 2 are represented by the same reference numerals, and detailed description thereof will not be repeated. Hereinafter, description will be provided focusing on the difference from Examples 1, 2.

In Example 2, if the volume of the negative electrode active material layer 121*b* or the positive electrode active material layer 122*b* is not changed, the volume fraction $\varepsilon_{e,j}$ changes. There is a case where the volume of each of the active material layers 121*b*, 122*b* changes by expansion or contraction of the active material. In this case, it is necessary to take into consideration change in volume of each of the active material layers 121*b*, 122*b*.

Accordingly, in this example, the flow velocity $u_j$ is calculated taking into consideration change in volume of each of the active material layers 121*b*, 122*b*. If the volume of each of the active material layers 121*b*, 122*b* changes, in each of the active material layers 121*b*, 122*b*, the volume fraction $\varepsilon_{e,j}$ changes according to change in volume of the space where the electrolyte exists. Taking into consideration this point, the volume fraction $\varepsilon_{e,j}$ can be calculated. Hereafter, a method of calculating the volume fraction $\varepsilon_{e,j}$ will be described specifically.

In this example, change in volume of each of the active material layers 121*b*, 122*b* is regarded as change in thickness of each of the active material layers 121*b*, 122*b*. The thickness of each of active material layers 121*b*, 122*b* is the length of each of the active material layers 121*b*, 122*b* in the direction (the up-down direction of FIG. 7) in which the negative electrode plate 121 and the positive electrode plate 122 are opposed to each other.

When the thickness of the power generation element 120 changes by the amount of change in thickness of each of the active material layers 121*b*, 122*b*, the variation of the thickness of the power generation element 120 is expressed by Expression (15). The thickness of the power generation element 120 is the length of the power generation element 120 in the Y direction in FIG. 4.

[Equation 12]

$$\Delta y_0 = \Delta y_p + \Delta y_n + \Delta y_s = y_p \times \beta_p + y_n \times \beta_n + y_s \times \beta_s \quad (15)$$

In Expression (15), $\Delta y_0$ is the variation of the thickness of the power generation element 120. The variation $\Delta y_0$ is the total sum of the variation $\Delta y_p$ of the thickness of the positive electrode active material layer 122*b*, the variation $\Delta y_n$ of the thickness of the negative electrode active material layer 121*b*, and the variation $\Delta y_s$ of the thickness of the separator 123. In Expression (15), the variation $\Delta y_s$ of the thickness of the separator 123 is also taken into consideration. The thickness of the separator 123 is the length of the separator 123 in the direction (the up-down direction of FIG. 7) in which the negative electrode plate 121 and the positive electrode plate 122 are opposed to each other. The variation $\Delta y_s$ may be neglected.

The variation $\Delta y_p$ is calculated by multiplying the thickness (thickness before change) $y_p$ of the positive electrode active material layer 122*b* by the volume expansion rate $\beta_p$ of the positive electrode active material. The variation $\Delta y_n$ is calculated by multiplying the thickness (thickness before change) $y_n$ of the negative electrode active material layer 121*b* by the volume expansion rate $\beta_n$ of the negative electrode active material. The variation $\Delta y_s$ is calculated by multiplying the thickness (thickness before change) $y_s$ of the separator 123 by the volume expansion rate $\beta_s$ of a material (the separator 123 itself) for forming the separator 123.

There is a case where a constraint force is applied to the secondary battery 10. The constraint force is a force which nips the secondary battery 10 in the Y direction. In order to fix the secondary battery 10 or to secure the input/output performance of the power generation element 120, there is a case where the constraint force is applied to the secondary battery 10. When the constraint force is applied to the secondary battery 10 (power generation element 120), and change in thickness of the power generation element 120 is limited, the variation $\Delta y$ of the thickness of the power generation element 120 becomes smaller than the variation $\Delta y_0$. That is, the variation $\Delta y$ becomes a variation when a force when the thickness of the power generation element 120 changes is balanced with the constraint force applied to the power generation element 120.

Figure 11:
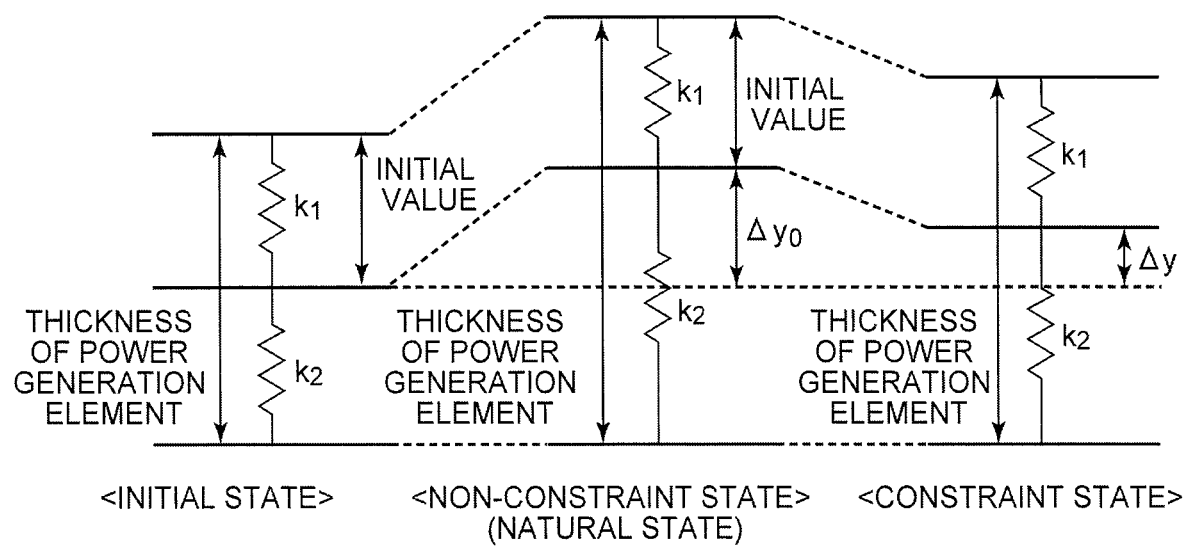
FIG. 11 is a diagram illustrating change in thickness of the secondary battery using a spring model.

The change in thickness of the secondary battery 10 will be described using a spring model shown in FIG. 11. The secondary battery 10 is constituted by a portion (referred to a non-impregnated portion) into which the electrolyte is not impregnated and a portion (referred to an impregnated portion) into which the electrolyte is impregnated. The non-impregnated portion is the battery case 110 and the current collector foils 121*a*, 122*a*. The impregnated portion is the negative electrode active material layer 121*b*, the positive electrode active material layer 122*b*, and the separator 123. In FIG. 11, a spring constant $k_1$ is a spring constant (fixed value) of the non-impregnated portion, and a spring constant $k_2$ is a spring constant (fixed value) of the impregnated portion.

An initial state shown in FIG. 11 is a state before each of the active material layers 121*b*, 122*b* and the separator 123 expand. The thickness of the non-impregnated portion shows an initial value. In a state (non-constraint state, that is, natural state) where the constraint force is not applied to the secondary battery 10, the thickness of the power generation element 120 increases by the variation $\Delta y_0$ compared to the thickness in the initial state by expansion of each of the active material layers 121*b*, 122*b* and the separator 123. The thickness of the non-impregnated portion is maintained at the initial value.

In a state (constraint state) where the constraint force is applied to the secondary battery 10, a force corresponding to the variation $\Delta y_0$ is balanced with the constraint force. The power generation element 120 contracts by the constraint force, and the thickness of the power generation element 120 in the constraint state becomes smaller than the thickness of the power generation element 120 in the non-constraint state. In the constraint state, the thickness of the impregnated portion becomes larger than the thickness in the initial state by the variation $\Delta y$. Here, the variation $\Delta y$ is smaller than the variation $\Delta y_0$.

In the constraint state shown in FIG. 11, the relationship (the force-balance relationship) shown in (16) is established.

[Equation 13]

$$\frac{k_2(\Delta y_0 - \Delta y)}{H} + \int p\, dx = \frac{k_1 \Delta y}{H} \quad (16)$$

In Expression (16), H denotes the height (fixed value) of the power generation element 120, p denotes the pressure of the electrolyte in the constraint state, and x denotes the position of the power generation element 120 in the X direction. The spring constants $k_1$, $k_2$ can be calculated in advance by an experiment or the like. The height H is the length of the power generation element 120 in the Z direction in FIG. 2 or 4, and can be calculated in advance.

The variation $\Delta y_0$ depends on the battery temperature Tb or the SOC of the secondary battery 10. For this reason, if information (map or calculation expression) representing the correspondence relationship between at least one of the battery temperature Tb and the SOC and the variation $\Delta y_0$ is prepared in advance by an experiment or the like, the variation $\Delta y_0$ can be specified by specifying the battery temperature Tb or the SOC. If the variation $\Delta y_0$ is specified, the variation $\Delta y$ can be expressed by a function including the pressure p as a variable.

The variation $\Delta y$ is the variation of the thickness of the entire power generation element 120. The variations $\Delta y_p$, $\Delta y_e$, $\Delta y_s$ in the active material layers 121b, 122b and the separator 123 can be calculated from the ratio of the spring constants in the active material layers 121b, 122b and the separator 123, and the variation $\Delta y$. Specifically, the variations $\Delta y_p$, $\Delta y_n$, $\Delta y_s$ are expressed by Expression (17).

[Equation 14]

$$\left.\begin{array}{l}\Delta y_p = \dfrac{k_n k_s}{k_p k_s + k_n k_s + k_p k_n}\Delta y \\[4pt] \Delta y_n = \dfrac{k_p k_s}{k_p k_s + k_n k_s + k_p k_n}\Delta y \\[4pt] \Delta y_s = \dfrac{k_p k_n}{k_p k_s + k_n k_s + k_p k_n}\Delta y\end{array}\right\} \quad (17)$$

In Expression (17), $k_n$ denotes a spring constant (fixed value) of the negative electrode active material layer 121b, $k_p$ denotes a spring constant (fixed value) of the positive electrode active material layer 122b, and $k_s$ is a spring constant (fixed value) of the separator 123. Each of the spring constants $k_n$, $k_p$, $k_s$ can be calculated in advance by an experiment or the like.

If the variations $\Delta y_p$, $\Delta y_n$, $\Delta y_s$ are used, the thickness $y_p$, $y_n$, $y_s$ of the active material layers 121b, 122b and the separator 123 can be understood. That is, the present thickness $y_j$ can be calculated by adding the variation $\Delta y_j$ ($\Delta y_p$, $\Delta y_n$, $\Delta y_s$) calculated by Expression (17) to the thickness $y_j$ calculated in the previous calculation cycle.

If the variations $\Delta y_p$, $\Delta y_n$, $\Delta y_s$ are used, in each of the positive electrode active material layer 122b, the negative electrode active material layer 121b, and the separator 123, the variation $\Delta V_{e,j}$ of the volume of the space where the electrolyte exists can be calculated. $V_{e,j}$ is the volume of the space where the electrolyte exists in each of the active material layers 121b, 122b and the separator 123. The variation $\Delta V_{e,j}$ is expressed by Expression (18).

[Equation 15]

$$\Delta V_{e,j} = \Delta V_{all,j} - \Delta V_{s,j} \quad (18)$$

In Expression (18), $V_{s,j}$ denotes the volume ($V_{s,n}$, $V_{s,p}$) of the active material included in each of the active material layers 121b, 122b in each of the active material layers 121b, 122b, and denotes the volume ($V_{s,s}$) of the separator 123 itself in the separator 123. The variation of the volume $V_{s,j}$ becomes $\Delta V_{s,j}$. $V_{all,j}$ is the total sum of the volume $V_{s,j}$ and the volume $V_{e,j}$. The variation of the volume $V_{all,j}$ becomes $\Delta V_{all,j}$.

The variation $\Delta V_{all,j}$ and the variation $\Delta V_{s,j}$ are expressed by Expressions (19), (20).

[Equation 16]

$$\Delta V_{all,j} = V_{all,j}\frac{\Delta y_j}{y_j} \quad (19)$$

$$\Delta V_{s,j} = \beta_j V_{s,j} = (1 - \varepsilon_{e,j}) V_{all,j}\beta_j \quad (20)$$

When calculating the variation $\Delta V_{all,j}$ based on Expression (19), as the volume $V_{all,j}$ and the thickness $y_j$, the values calculated in the previous calculation cycle are used. As the variation $\Delta y_j$, Expression (17) is used. As described in Example 2, the volume expansion rate $\beta_j$ in Expression (20) can be calculated from the battery temperature Tb or the SOC of the secondary battery 10. As the volume fraction $\varepsilon_{e,j}$ and the volume $V_{all,j}$ in Expression (20), the values calculated in the previous calculation cycle are used.

If the variations $\Delta V_{all,j}$, $\Delta V_{s,j}$ are calculated based on Expressions (19), (20), the variation $\Delta V_{e,j}$ can be calculated based on Expression (18). Since the volume expansion rate $\beta_j$ is included in Expression (20), the variation $\Delta V_{e,j}$ can be calculated based on the volume expansion rate $\beta_j$.

In the expression (Expressions (1), (10) to (12)) which calculates the flow velocity $u_j$ of the electrolyte, the variation $\Delta V_{e,j}$ is not included as a parameter. However, when the volume of the space where the electrolyte exists changes, since the volume fraction $\varepsilon_{e,j}$ of the electrolyte changes, the variation $\Delta V_{e,j}$ can be converted to the variation $\Delta \varepsilon_{e,j}$. Specifically, when it is assumed that the volume $V_{all,j}$ is a prescribed given volume $V_{all\_model,j}$, as in Expression (21), the variation $\Delta \varepsilon_{e,j}$ can be calculated from the volume $V_{all\_model,j}$ and the variation $\Delta V_{e,j}$.

[Equation 17]

$$\Delta \varepsilon_{e,j} = \frac{\Delta V_{e,j}}{V_{all\_model,j}} = \frac{V_{all,j}}{V_{all\_model,j}}\left(\frac{\Delta y_j}{y_j} - (1 - \varepsilon_{e,j})\beta\right) \quad (21)$$

If the variation $\Delta \varepsilon_{e,j}$ is calculated, the present volume fraction $\varepsilon_{e,j}$ can be calculated by adding the variation $\Delta \varepsilon_{e,j}$ to the volume fraction $\varepsilon_{e,j}$ calculated in the previous calculation cycle. If the volume fraction $\varepsilon_{e,j}$ calculated at this time is used, the flow velocity $u_j$ can be calculated based on Expressions (1), (2) or Expressions (10) to (12). When calculating the salt concentration $c_{e,j}$ based on Expression (13), the volume fraction $\varepsilon_{e,j}$ calculated at this time can be used.

According to this example, the volume fraction $\varepsilon_{e,j}$ is calculated taking into consideration when the volume (specifically, thickness) in each of the active material layers 121b, 122b and the separator 123 changes. With this, when the volume changes, it is possible to improve the calculation accuracy of the flow velocity $u_j$. Accordingly, it is possible to improve the calculation accuracy of the salt concentration distribution or to improve the calculation accuracy of the resistance increase amount Rh.

The transmission coefficient $K_j$ depends on the thickness $y_j$ (that is, thickness $y_p$, $y_n$, $y_s$) in each of the active material layer 121b, 122b and the separator 123. For example, in the positive electrode active material layer 122b, when the volume of the positive electrode active material is constant, since the larger the thickness $y_p$ of the positive electrode active material layer 122b becomes, the more easily the electrolyte moves in the positive electrode active material layer 122b, the transmission coefficient $K_p$ becomes larger.

When the volume of the positive electrode active material is constant, since the smaller the thickness $y_p$ of the positive electrode active material layer 122b becomes, the more hardly the electrolyte moves in the positive electrode active material layer 122b, the transmission coefficient $K_p$ becomes smaller. Similarly, when the volume of the separator 123 itself is constant, since the larger the thickness $y_s$ of the separator 123 becomes, the more easily the electrolyte moves in the separator 123, the transmission coefficient $K_s$ of the separator 123 becomes larger. When the volume of the separator 123 itself is constant, since the smaller the thickness $y_s$ of the separator 123 becomes, the more hardly the electrolyte moves in the separator 123, the transmission coefficient $K_s$ becomes smaller.

Accordingly, if information (map or calculation expression) representing the correspondence relationship between the transmission coefficient $K_j$ and the thickness $y_j$ is prepared in advance by an experiment or the like, the transmission coefficient $K_j$ according to the thickness $y_j$ can be specified. The transmission coefficient $K_j$ specified in this way can be used in Expression (1) or Expressions (10) to (12).

The transmission coefficient $K_j$ depends on the volume expansion rate $\beta_j$. For example, in the positive electrode active material layer 122b, when the thickness $y_p$ is constant, since the more the positive electrode active material expands, the more hardly the electrolyte moves in the positive electrode active material layer 122b, the transmission coefficient $K_p$ becomes smaller. When the thickness $y_p$ is constant, the more the positive electrode active material contracts, the more easily the electrolyte moves in the positive electrode active material layer 122b, the transmission coefficient $K_p$ becomes larger. Similarly, when the thickness $y_s$ of the separator 123 is constant, the more the separator 123 itself expands, the more hardly the electrolyte moves in the separator 123, the transmission coefficient $K_s$ becomes smaller. When the thickness $y_s$ is constant, the more the separator 123 itself contracts, the more easily the electrolyte moves in the separator 123, the transmission coefficient $K_s$ becomes larger.

Accordingly, if information (map or calculation expression) representing the correspondence relationship between the transmission coefficient $K_j$ and the volume expansion rate $\beta_j$ is prepared in advance by an experiment or the like, the transmission coefficient $K_j$ according to the volume expansion rate $\beta_j$ can be specified. The transmission coefficient $K_j$ specified in this way can be used in Expression (1) or Expressions (10) to (12). As described in Example 2, the volume expansion rate $\beta_j$ can be calculated based on the battery temperature Tb or the SOC of the secondary battery 10.

When specifying the transmission coefficient $K_j$, at least one of the thickness $y_j$ and the volume expansion rate $\beta_j$ can be taken into consideration. When taking into consideration both of the thickness $y_j$ and the volume expansion rate $\beta_j$, information (map or calculation expression) representing the correspondence relationship between both of the thickness $y_j$ and the volume expansion rate $\beta_j$ and the transmission coefficient $K_j$ may be prepared in advance by an experiment or the like.

In the above description, although the spring constants $k_1$, $k_2$ in Expression (16) are set to fixed values, the spring constants $k_1$, $k_2$ may be varied. If portions (impregnated portion and non-impregnated portion) which define the spring constants $k_1$, $k_2$ contract from the non-constraint state shown in FIG. 11, the spring constants $k_1$, $k_2$ become larger. Since the more the impregnated portion expands, the non-impregnated portion contracts, the spring constant $k_1$ of the non-impregnated portion can be calculated based on the variation $\Delta y$. Specifically, if information (map or calculation expression) representing the correspondence relationship between the variation $\Delta y$ and the spring constant $k_1$ is prepared in advance by an experiment or the like, the spring constant $k_1$ can be calculated by calculating the variation $\Delta y$. When calculating the spring constant $k_1$, the variation $\Delta y$ calculated in the previous calculation cycle can be used.

As described referring to FIG. 11, the impregnated portion contracts by the amount corresponding to the difference ($\Delta y_0 - \Delta y$) between the variation $\Delta y_0$ and the variation $\Delta y$. Accordingly, the spring constant $k_2$ can be calculated based on the difference ($\Delta y_0 - \Delta y$). Specifically, if information (map or calculation expression) representing the correspondence relationship between the difference ($\Delta y_0 - \Delta y$) and the spring constant $k_2$ is prepared in advance by an experiment or the like, the spring constant $k_2$ can be calculated by calculating the difference ($\Delta y_0 - \Delta y$). When calculating the spring constant $k_2$, the difference ($\Delta y_0 - \Delta y$) calculated in the previous calculation cycle can be used.

Since the impregnated portion becomes the negative electrode active material layer 121b, the positive electrode active material layer 122b, and the separator 123, the spring constant $k_2$ includes the spring constants $k_n$, $k_p$, $k_s$. Similarly to when calculating the spring constant $k_2$, each of the spring constants $k_n$, $k_p$, $k_s$ can be calculated based on the difference ($\Delta y_{0,j} - \Delta y_j$). The variation $\Delta y_{0,j}$ is a variation occupied by each of the active material layers 121b, 122b and the separator 123 out of the variation $\Delta y_0$. When calculating each of the spring constants $k_n$, $k_p$, $k_s$, the difference ($\Delta y_{0,j} - \Delta y_j$) calculated in the previous calculation cycle can be used. Each of the spring constants $k_n$, $k_p$, $k_s$ calculated in this way is used in Expression (17).

The invention claimed is:

1. A battery system comprising:
    a secondary battery including a power generation element configured to perform charging and discharging, an electrolyte, and a battery case, the power generation element comprising a negative electrode plate, a separator and a positive electrode plate being laminated in this order, the electrolyte being impregnated inside the power generation element, and the power generation element and the electrolyte being housed in the battery case;
    a temperature sensor configured to specify a temperature of the secondary battery; and a controller configured to:
    (a) calculate a deviation in salt concentration in the electrolyte in an x direction,
        wherein the x direction is perpendicular to a lamination direction of the negative electrode plate, the separator and the positive electrode plate,
    (b) calculate a first flow velocity and a second flow velocity at each position in the power generation element using a first equation defining a flow of the electrolyte, wherein the first flow velocity is a flow velocity of the electrolyte in the x direction when the electrolyte flows from an inside of the power generation element toward an outside of the power generation element, the second flow velocity is a flow velocity of the electrolyte in the x direction when the electrolyte flows from the outside of the power generation element toward the inside of the power generation element, the first equation includes a density of the electrolyte as an input parameter, the density is specified from the temperature, and the density changes according to the temperature of the secondary battery, (c) calculate a salt concentration distribution in the power generation element using a second equation, wherein the second equation includes the first flow velocity of the electrolyte in the x direction and the second flow velocity of the electrolyte in the x direction as input parameters, and (d) estimate a state of charge (SOC) of the secondary battery and control at least one of charging of the secondary battery based on the calculated salt concentration distribution.

2. The battery system according to claim 1, wherein
the positive electrode plate and the negative electrode plate each include an active material,
the first equation includes a volume fraction of the electrolyte in the power generation element, and
the controller is further configured to
specify a volume expansion rate of the active material based on at least one of the temperature and the state of charge of the secondary battery, when the controller calculates the first flow velocity and the second flow velocity using the equation,
calculate a variation of the volume fraction based on the volume expansion rate, and
specify the volume fraction based on the variation.

3. The battery system according to claim 2, wherein
the controller is further configured to
calculate a volume variation of a space where the electrolyte exists in the power generation element based on the volume expansion rate of the active material, when a volume of the power generation element changes according to change in a volume of the active material, and
calculate a variation of the volume fraction for use in the first equation based on the volume variation.

4. The battery system according to claim 1, wherein the controller is configured to calculate the salt concentration distribution in the power generation element based on the first flow velocity and the second flow velocity at each position and a production amount of salt in the electrolyte accompanied with charging and discharging of the power generation element.

5. The battery system according to claim 1, wherein the controller is configured to calculate the salt concentration distribution in the power generation element based on the first flow velocity and the second flow velocity at each position, a production amount of salt in the electrolyte accompanied with charging and discharging of the power generation element, and a diffusion state of salt in the electrolyte.

6. The battery system according to claim 1, wherein the controller is configured to calculate a resistance increase amount corresponding to at least one of a maximum difference and an average value specified from the salt concentration distribution in the power generation element using a predetermined correspondence relationship, the predetermined correspondence relationship is a correspondence relationship between a resistance increase amount when an internal resistance value of the secondary battery increases with the deviation in salt concentration in the electrolyte, and at least one of the maximum difference and the average value in the salt concentration distribution.

7. A battery system comprising:
a secondary battery including a power generation element configured to perform charging and discharging, an electrolyte, and a battery case, the electrolyte being impregnated inside the power generation element, the power generation element and the electrolyte being housed in the battery case; and
a controller configured to
(a) calculate flow velocities of the electrolyte moving inside the power generation element, the flow velocities being flow velocities at different positions in a predetermined direction inside the power generation element and the predetermined direction being a moving direction of the electrolyte,
(b) calculate a salt concentration distribution of the electrolyte in the predetermined direction using an equation including the flow velocities as an input parameter, and
(c) estimate a state of charge (SOC) of the secondary battery and control charging or discharging of the secondary battery based on the calculated salt concentration distribution.

8. The battery system according to claim 7, wherein the flow velocities are flow velocities when the electrolyte or the power generation element expands.

9. The battery system according to claim 7, wherein the flow velocities are flow velocities when the electrolyte or the power generation element contracts.

10. The battery system according to claim 7, wherein the flow velocities are flow velocities when the electrolyte or the power generation element expands and when the electrolyte or the power generation element contracts.

11. The battery system according to claim 7, wherein
the secondary battery further includes an internal resistance, and
the controller is configured to calculate an increase amount of the internal resistance based on the salt concentration distribution.

12. The battery system according to claim 7, wherein the controller is configured to calculate the flow velocities using an equation, the equation includes, as a parameter, a density of the electrolyte or a volume change rate of the power generation element.

13. The battery system according to claim 12, wherein the controller is configured to calculate the temperature of the secondary battery, and the controller is configured to calculate the density based on the temperature.

* * * * *